(12) United States Patent
Motohashi et al.

(10) Patent No.: US 7,598,747 B2
(45) Date of Patent: *Oct. 6, 2009

(54) NOISE INJECTION APPARATUS FOR PRINTED CIRCUIT BOARD

(75) Inventors: Kenji Motohashi, Kanagawa (JP); Hideji Miyanishi, Kanagawa (JP); Kazumasa Aoki, Tokyo (JP); Toshinobu Shoji, Kanagawa (JP); Kikuo Kazama, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 148 days.

This patent is subject to a terminal disclaimer.

(21) Appl. No.: 11/654,587

(22) Filed: Jan. 18, 2007

(65) Prior Publication Data

US 2007/0178760 A1   Aug. 2, 2007

(30) Foreign Application Priority Data

Jan. 27, 2006   (JP) ............................ 2006-019220

(51) Int. Cl.
*G01R 31/08* (2006.01)

(52) U.S. Cl. ...................... 324/512; 324/555

(58) Field of Classification Search ................. 324/613, 324/628, 512, 555, 754, 755; 331/78
See application file for complete search history.

(56) References Cited

U.S. PATENT DOCUMENTS

| 6,194,909 B1* | 2/2001 | Belforte et al. ............. 324/763 |
| 2006/0181287 A1* | 8/2006 | Motohashi et al. .......... 324/613 |

FOREIGN PATENT DOCUMENTS

| JP | 62-8534 | 2/1987 |
| JP | 3263672 | 9/1999 |
| JP | 2002-318253 | 10/2002 |

* cited by examiner

*Primary Examiner*—David Mis
(74) *Attorney, Agent, or Firm*—Harness, Dickey & Pierce, P.L.C.

(57) ABSTRACT

A noise injection apparatus for injecting noise to a printed circuit board is disclosed that includes a signal generator that generates noise, a coaxial cable having one end connected to an output of the signal generator, and a probe that is connected to another end of the coaxial cable and is configured to convey the noise generated by the signal generator to a power supply and a ground pin of a device element of the printed circuit board via the coaxial cable.

10 Claims, 10 Drawing Sheets

NOISE INJECTION APPARATUS FOR PRINTED CIRCUIT BOARD

BACKGROUND OF THE INVENTION

1. Field of the Invention

The present invention relates to a noise injection apparatus for injecting noise to a printed circuit board that is used for noise analysis of the printed circuit board.

2. Description of the Related Art

In order to process huge amounts of information, techniques are being developed for increasing the operation speed of electronic devices, and in turn, EMI (Electromagnetic Interference) discharged from the electronic device is increasing so that countering such noise is becoming difficult. It is noted that EMI radiated from an electronic device may cause operation errors of neighboring electronic devices. Thus, many countries impose certain EMI legal requirements, and in such countries, import and distribution of electronic devices may not be authorized unless the electronic devices conform to the EMI requirements. When electronic devices fail to satisfy EMI requirements, the distribution and sales of the electronic devices may have to be stopped so that the company responsible for distributing the electronic devices may suffer significant damages. Despite such a risk of damage, countermeasures against EMI have not been taken into serious consideration in the field of electronic device technology.

It is noted that the number of noise sources in a printed circuit board has increased due to increased operation speed, complication in design, and high densification of the circuit, and in turn, determination of the noise source is becoming difficult. Of particular concern is noise emitted from a device IC due to increased circuit operation speed.

However, since a number of noise sources exist within a printed circuit board, it is quite difficult to determine the noise source that is generating noise at a problematic frequency.

If there were only one noise source, noise generated within the printed circuit board at a predetermined frequency may be easily measured using a commercial noise visualization apparatus, for example, to determine whether a problem exists and find the cause of the problem based on the noise distribution analysis obtained by the noise visualization apparatus.

It is noted that a method of injecting noise to a printed circuit board is disclosed in Japanese Patent No. 3263672 ("Apparatus and Method for Injection of Noise"), for example. Specifically, the above reference discloses a technique that involves superposing noise (common mode or normal mode) on a commercial power supply while the power of a measured device is turned on, and injecting noise (common mode or normal mode) to the power supply and ground of the measured device. However, according to this method, since noise is injected into the power supply of a unit, the noise source that is causing a problem may not be identified.

Also, since emissions from a device (IC) may be in various frequency bands, noise has to be injected while taking into account the impedance of the noise injecting unit according to the frequency band of the noise being injected.

Further, the disclosed method is limited to assessing noise of a device in operation. However, it is desired that noise evaluation be made possible at the substrate level before the device may be fully operated to determine how noise radiates from the power supply, for example.

It is noted that another related technique is disclosed in Japanese Laid-Open Patent Publication No. 2002-318253 ("Noise Visualization System and Display Method thereof"), for example. Specifically, the above reference discloses a method of injecting a high frequency signal that simulates noise to an examined object from an injection probe via a wire harness. However, in the above-disclosed technique, standing wave that may be superposed on a cable that connects a signal generator to the probe is not taken into consideration, and measurement results obtained from the noise visualization system according to the disclosed technique may be affected by the emissions from the cable. Thus, the actual noise measurements of the substrate itself may not be obtained using this technique.

Also, if measurement results of the substrate itself cannot be obtained by the noise visualization system due to emissions from the cable, this means that measurement results may vary depending on the positional relation between the cable and the substrate at the time of measurement. Therefore, a measurement method is desired that can block interference by the emissions from the cable.

It is noted that another related technique is disclosed in Japanese Utility Model Publication No. 62-8534 ("Noise Simulator"), for example. Specifically, the above reference discloses a technique that involves applying a pulse voltage from a pulse generating circuit via a coupler to a circuit component of an examined device such as one of a group of ICs mounted on a printed circuit board. In this way, a pulse voltage may be applied to each individual IC to identify the IC that is causing the same operation error as the operation error that is currently occurring in the device and implement countermeasures for the relevant IC and associated circuits thereof. However, according to this technique, the coupler is merely a flat metal plate or a metal plate arranged into a horse shoe shape that is coated with insulating material, and a matching device is not used so that efficient application of noise may be difficult.

As can be appreciated, plural noise sources exist within a printed circuit board, and identifying the noise source generating noise at the problematic frequency has been quite difficult. In the case where a method of injecting noise into the power supply of a unit is employed, the noise source causing a problem within the unit cannot be identified.

Also, in the case of implementing the technique disclosed in Japanese Patent No. 3263672, since emissions from a device (IC) may be in various frequency bands, noise has to be injected while taking into account the impedance of the noise injection unit according to the frequency band of the noise being injected.

Further, the above technique is limited to implementation for a device that is in operation. However, it is desired that noise evaluation be enabled to determine how noise is radiated from the power supply, for example, at the substrate level or before the device can be fully operated.

In the case of implementing the technique disclosed in Japanese Laid-Open Patent Publication No. 2002-318253, emissions from the cable may be included in the measurement results obtained by the noise visualization system so that the actual noise measurement of the substrate itself may not be obtained. When noise measurement of the substrate itself cannot be obtained due to emissions from the cable, measurement results may vary depending on the positional relation between the cable and the substrate.

In the case of implementing the technique disclosed in Japanese Utility Model Publication No. 62-8534, a flat metal plate or a metal plate arranged into a horse shoe shape that is coated by an insulating material has to be used as the coupler. Although, emissions from a coaxial cable may be prevented by such an arrangement, noise may not be efficiently transmitted in this case and deviations may occur in measurements so that accurate measurement may not be obtained.

Also, it is noted that the above disclosures are concerned with noise coming into a device; however, there is a need to consider noise being emitted out of a device as well.

SUMMARY OF THE INVENTION

According to an aspect of the present invention, a noise injection apparatus for injecting noise to a printed circuit board is provided that enables experimentally injecting a signal (noise) at a given frequency from the exterior to a power supply and a ground pin of a device element of a printed circuit board in an efficient manner.

According to one embodiment of the present invention, a noise injection apparatus for a printed circuit board is provided that injects noise to a power supply and a ground pin of a device element of the printed circuit board to identify areas of the printed circuit board that may cause EMI-related problems, the apparatus including:

a signal generator that generates noise;

a coaxial cable having one end connected to an output of the signal generator; and a probe that is connected to another end of the coaxial cable and is configured to convey the noise generated by the signal generator to a power supply and a ground pin of a device element of the printed circuit board via the coaxial cable.

In one preferred embodiment, the probe may be a semi-rigid cable that includes an SMA connector.

According to another embodiment of the present invention, a noise injection apparatus for injecting noise to a printed circuit board is provided that injects noise to a power supply and a ground pin of a device element of the printed circuit board to identify areas of the printed circuit board that may cause EMI-related problems, the apparatus including:

a signal generator that generates noise;

a coaxial cable having one end connected to the signal generator; and an impedance matching unit that is connected to another end of the coaxial cable and is configured to convey the noise generated by the signal generator to a power supply and a ground pin of a device element of the printed circuit board via the coaxial cable.

In one preferred embodiment, the impedance matching unit may include an SMA connector that is connected to the coaxial cable, a matching circuit that matches an impedance of the signal generator to an impedance of the printed circuit board, a copper substrate on which one or more circuit components including the matching circuit are mounted, a ground connecting copper plate member that is connected to the ground pin of the printed circuit board, and a wire that is connected to the power supply of the printed circuit board.

In another preferred embodiment, the matching circuit may include a first capacitor, a second capacitor, a resistor, a first inductor, and a second inductor;

the first capacitor may have one end connected to a signal output of the signal generator and another end connected to one end of the second capacitor and one end of the resistor;

the resistor may have another end connected to one end of the first inductor and one end of the second inductor; and the second capacitor and the second inductor may each have another end connected to ground.

According to another embodiment of the present invention, a noise injection apparatus for injecting noise to a printed circuit board is provided that fixes the relative positioning of a cable and the printed circuit board so that emissions from the cable may be prevented from affecting measurement of the printed circuit board, the apparatus including:

a printed circuit board support member that fastens the printed circuit board in place;

a probe including an SMA connector; and a probe support member that fastens the probe such that the SMA connector of the probe is positioned perpendicular to a measuring surface of the printed circuit board.

According to another embodiment of the present invention, a noise injection apparatus for injecting noise to a printed circuit board is provided that converts an oscillator output into a sine wave signal using a band pass filter, the apparatus including:

an oscillator unit that includes an oscillating circuit that uses the band pass filter to output the sine wave signal, the oscillating circuit including an oscillator that outputs a signal at a given frequency, a coil that removes spurious components included in the output of the oscillator, a substrate on which circuit components including the oscillator and the coil are mounted, a battery for operating the circuit components, and a probe connecting SBA connector.

In one preferred embodiment, the band pass filter may include a first tuned circuit having a first inductor and a first capacitor, a second capacitor, and a second tuned circuit having a second inductor and a third capacitor;

the oscillator may output a rectangular wave signal at the given frequency;

the first tuned circuit may remove spurious components included in the output of the oscillator and pass a resulting output to the second tuned circuit via the second capacitor; and the second tuned circuit may secure bandwidth and attenuation of the resulting output from the first tuned circuit and output a signal at the given frequency to the printed circuit board via the probe connecting SMA connector.

According to another embodiment of the present invention, a noise injection apparatus for injecting noise to a printed circuit board is provided that fastens the printed circuit board to a dedicated fastener and places an oscillator unit under the printed circuit board, the apparatus including:

the dedicated fastener that fastens the printed circuit board in place;

the oscillator unit that is placed under the printed circuit board; and a base that places the oscillator unit under the printed circuit board.

In one preferred embodiment, when the oscillator unit is relatively small in size, the oscillator unit may be directly attached to the printed circuit board without using the base.

According to another embodiment of the present invention, a noise injection apparatus for injecting noise to a printed circuit board is provided that is arranged to cancel the effects of standing waves superposed on a coaxial cable, the apparatus including:

an oscillator unit that includes an oscillator that outputs a signal at a given frequency, a buffer circuit having a plurality of inverters that are connected in parallel, a substrate on which circuit components including the oscillator and the buffer circuit are mounted, a battery for operating the circuit components, and a signal output wire that is connected to the printed circuit board.

In one preferred embodiment, the noise injection apparatus may further include:

a dedicated fastener for fastening the printed circuit board in place; and a base that places the oscillator unit under the printed circuit board.

In another preferred embodiment, the signal output wire may be soldered to a power supply and ground of a device element of the printed circuit board.

According to an aspect of the present invention, by using a noise injection apparatus according to an embodiment of the present invention, noise at a given frequency that is radiated from a device terminal of a given noise source (device) of a printed circuit board that circulates within power supply and ground wirings of the printed circuit board as a high frequency current (magnetic field) may be viewed through a noise visualization apparatus to visually determine whether each individual device on the printed circuit board may cause a problem.

According to another aspect of the present invention, by introducing an impedance matching unit to a noise injection apparatus according to an embodiment of the present invention, a signal (noise) at a given frequency may be efficiently transmitted to the power supply and ground pin of a device (IC) of a printed circuit board that is subject to examination.

According to another aspect of the present invention, by using a dedicated fastener in a noise injection apparatus according to an embodiment of the present invention, measurements of a printed circuit board obtained by a noise visualization apparatus may be prevented from varying due to changes in the relative positioning of a coaxial cable and the printed circuit board, and variations in measurements may be reduced.

According to another aspect of the present invention, by using a Type-A miniature oscillator as an oscillator unit in a noise injection apparatus according to an embodiment of the present invention, emissions from a coaxial cable may be prevented from affecting measurement of a printed circuit board subject to examination so that the actual measurement of the printed circuit board itself may be obtained upon injecting noise to the power supply and ground of one of its devices (IC).

According to another aspect of the present invention, by using a Type-B miniature oscillator as an oscillator unit in a noise injection apparatus according to an embodiment of the present invention, emissions from a coaxial cable may be prevented from affecting the measurement of a printed circuit board subject to examination, and the output impedance of the noise injection apparatus may be adjusted to be closer to the output impedance of a device (IC) of the printed circuit board to which noise is to be injected so that a measurement of the printed circuit board that is close to its actual behavior may be obtained upon injecting a signal (noise) to the power supply and ground of the device (IC) of the printed circuit board.

According to another aspect of the present invention, by using a noise injection apparatus according to an embodiment of the present invention, a device corresponding to a noise source of a printed circuit board and a problematic frequency may be easily identified based on measurements of the printed circuit board obtained by a noise visualization apparatus so that procedures for conducting causal analysis of problems and implementing countermeasures for these problems may be simplified. Also, by implementing measures for reducing influences of emissions from a coaxial cable, preventing electromagnetic interference, and reducing variations in measurements, the accuracy of the measurements of a printed circuit board obtained by the noise visualization apparatus may be improved.

DESCRIPTION OF THE PREFERRED EMBODIMENTS

In the following, preferred embodiments of the present invention are described with reference to the accompanying drawings.

First Embodiment

In the following, a noise injection apparatus according to a first embodiment of the present invention is described. In the noise injection apparatus according to the first embodiment, noise is injected to the power supply and ground of a printed circuit board to identify a location where problematic EMI noise is generated using a cable and an external signal source for injecting noise at a given frequency to a noise source (device) on the printed circuit board.

Figure 1:
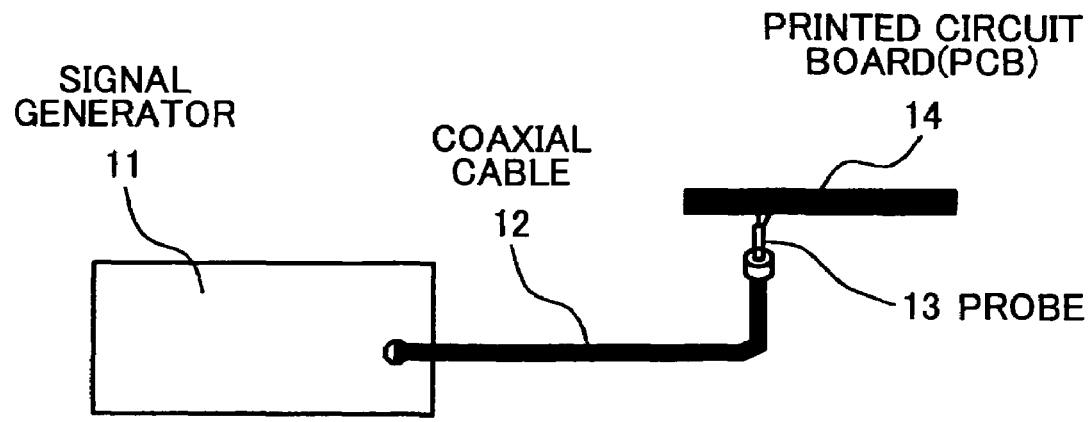
FIG. 1 is a diagram showing a configuration of a noise injection apparatus according to a first embodiment of the present invention.

FIG. 1 is a diagram illustrating a configuration of a noise injection apparatus for a printed circuit board according to the first embodiment.

The noise injection apparatus according to the present embodiment includes a commercial signal generator 11 as the external signal (noise) source, a coaxial cable 12 for transmitting the signal (noise) generated at the signal generator 11, a probe 13 for transmitting the signal (noise) conveyed from the coaxial cable 12 to a power supply and a ground pin of a device (IC) mounted on a printed circuit board 14 that is subject to examination.

The signal generator 11 is configured to output a clock waveform at a given frequency. In one embodiment, the signal generator may be adapted to output a sine wave.

The probe 13 transmits a signal (noise) to a power supply and a ground pin of a device mounted on the printed circuit board 14, and includes an SMA connector for establishing connection with the coaxial cable 12. Also, the probe 13 is arranged into a shape that enables solder connection of its power supply and ground pin.

In one embodiment, the probe 13 may be a semi-rigid cable that has an SMA connector attached thereto.

The printed circuit board 14 as the examined object may have passive components (e.g., resistors, inductors, and capacitors) connected between its power supply and ground. In one embodiment, the printed circuit board 14 does not have to accommodate active components such as ICs and other devices that constitute noise sources, and may instead have resistors connected between the power supply and ground terminals for such devices. In examining the printed circuit board 14 using a noise visualization apparatus, a signal (noise) at a given frequency may be set by the signal generator 11 corresponding to the external noise source, and the power supply and ground pin of the probe 13 may be soldered to the power supply and ground pin of a noise source on the printed circuit board 14 under examination. In this way, the signal (noise) at the given frequency may be viewed at the noise visualization apparatus as a high frequency current (magnetic field) supplied to the power supply and ground pin of the printed circuit board 14. Thus, locations within the printed circuit board having undesirable noise distribution characteristics may be identified based on the current flow (magnetic field) of the printed circuit board 14.

Figure 16:
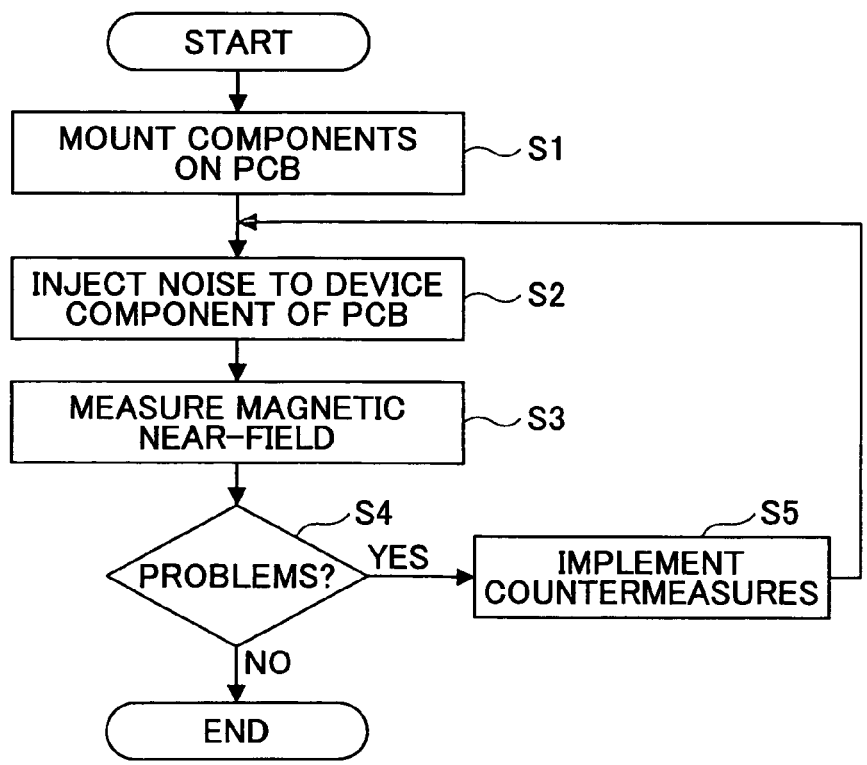
FIG. 16 is a flowchart illustrating process steps for performing magnetic near-field measurement on a printed circuit board.

FIG. 16 is a flowchart illustrating process steps for performing magnetic near-field measurement of a printed circuit board using a noise injection apparatus according to en embodiment of the present invention.

Figure 17:
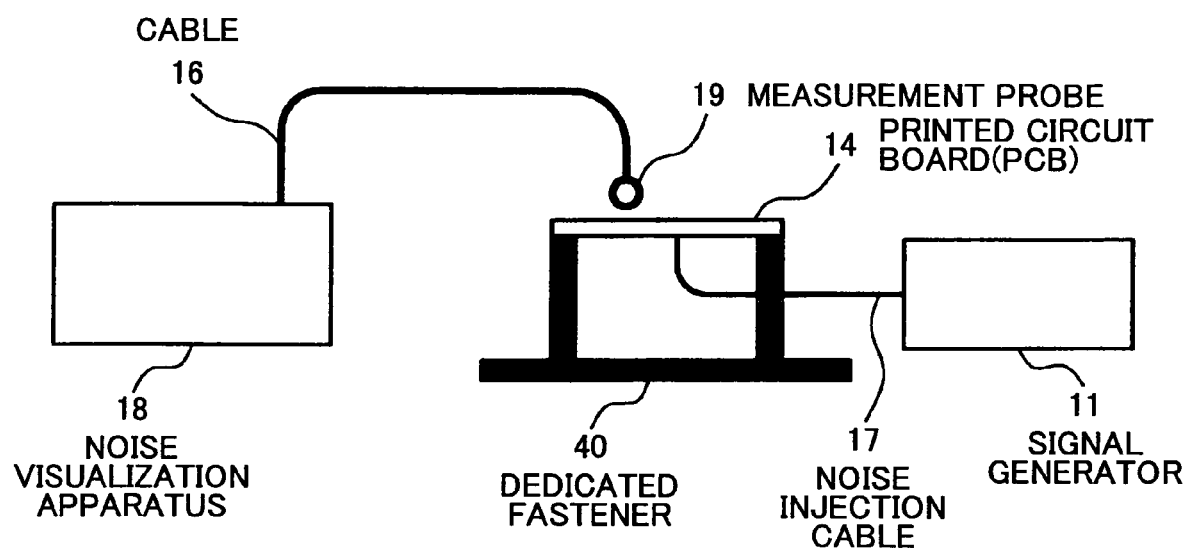
FIG. 17 is a diagram illustrating a noise visualization system for measuring the magnetic near-field of a noise-injected printed circuit board.

FIG. 17 is a diagram showing a configuration of a noise visualization system for measuring the magnetic near-field of a noise-injected printed circuit board.

According to FIG. 16, in step S1, a printed circuit board 14 that has electronic components mounted thereon is placed on a dedicated fastener 40. It is noted that in a case where noise being injected to a device may be absorbed by this device if the printed circuit board 14 has this device mounted thereon so that the intensity of the generated magnetic field may be reduced to a level that is inadequate for accurate measurement, the relevant device may be excluded and electronic components other than the relevant device may be mounted on the printed circuit board 14. In this case, since terminals that are interconnected by the device will be disconnected if the relevant device is simply excluded, a resistor may be connected in place of the device in an attempt to maintain the circuit characteristics of the printed circuit board 14. In this way, adequate magnetic field intensity for accurate measurement may be ensured.

In the case where plural devices are subject to noise injection in one measurement process, one or more of such devices may be excluded from being mounted on the printed circuit board 14. In other words, passive components such as resistors, inductors, and capacitors may be mounted on the printed circuit board 14 while some or all active components subject to measurement may be excluded. In this way, a printed circuit board may not have to be prepared for each device that is subject to examination.

Then, in step S2, noise is injected to a power supply pin of a device to be examined. In the case where the device to be examined is excluded in step S1, the noise may be injected to a portion (land or pad) on the printed circuit board 14 at which the power supply pin is to be connected to the excluded device.

In step S3, a measurement probe is arranged to scan the surface of the noise-injected printed circuit board 14 to measure its magnetic near-field. By scanning the surface of the noise-injected printed circuit board 14 with the measurement probe, an electromagnetic field intensity profile may be obtained.

Alternatively, in a case where measurement may be adequately made by obtaining an overall electromagnetic field intensity of the printed circuit board 14, the measurement probe may be positioned at a location that is distanced away from the printed circuit board 14 to measure its magnetic near-field.

In step S4, the obtained electromagnetic field intensity (profile) is compared with a standard profile to identify portions of the printed circuit board 14 that may cause problems and implement appropriate measures to counter such problems. After implementing the appropriate counter measures, the process steps of injecting noise (step S2), measuring the magnetic near-field (step S3), and analyzing the obtained measurement result (step S4) may be performed once more.

With respect to a power supply and a ground pin of the printed circuit board 14 to which a device component is not connected, the power supply and the ground pin for the device component of the printed circuit board 14 may be connected to a signal output and ground pin of the signal generator 11 of the noise injection apparatus after which the power of the signal generator 11 may be turned on. This may be regarded as creating an effect of superposing noise on the power supply of the device component of the printed circuit board 14. To view the magnetic field of the printed circuit board 14 when such noise is superposed on the power supply and ground of the device component, a noise visualization apparatus may be used to visualize the noise, for example.

FIG. 17 shows a noise visualization apparatus 18 for measuring the magnetic near-field of the printed circuit board 14 and control scanning operations of a measurement probe 19, the measurement probe 19 for obtaining the magnetic near-field of the printed circuit board 14, and a cable 16 for conveying the obtained magnetic near-field to the noise visualization apparatus 18. The noise injection apparatus comprises the printed circuit board 14 having device components connected between its power supply and ground, the signal generator 11 as the external noise source, the cable 16 for conveying noise from the noise generator 11 to the power supply of a device (IC) of the printed circuit board 14, and a dedicated fastener 40 for fastening the printed circuit board 14.

For example, based on the measurements of the magnetic near-field of the printed circuit board 14, if a location with a particularly high magnetic field is not found, countermeasures may not have to be implemented. However, when the magnetic field distribution of the printed circuit board 14 extends over a wide range, a capacitor may have to be introduced to the printed circuit board 14 as a countermeasure, for example. In this case, noise may be injected to the power supply of the device (IC) of the printed circuit board 14 after the countermeasure is implemented, and the measurement probe 19 may be placed over the printed circuit board 14 to scan the surface of the printed circuit board 14 and measure its magnetic near-field once again. In this way, the magnetic near-field of the printed circuit board 14 after the countermeasure is implemented may be measured and the effects of the countermeasure may be checked. If the resulting measurement does not indicate the existence of any problems, the process may be ended.

Second Embodiment

In the following, a noise injection apparatus according to a second embodiment of the present invention that uses an impedance matching unit to perform impedance matching with respect to impedances of the coaxial cable 12 and the impedance of the printed circuit board 14.

Figure 2:
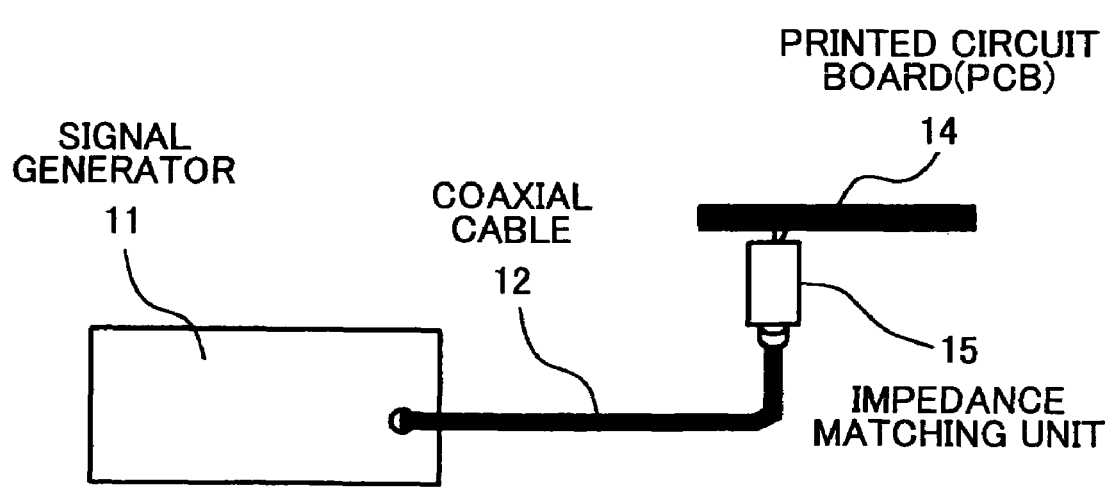
FIG. 2 is a diagram showing a configuration of a noise injection apparatus according to a second embodiment of the present invention.

FIG. 2 is a diagram showing a configuration of a noise injection apparatus for injecting noise to a printed circuit board according to the second embodiment.

As is described in relation to the first embodiment, in the case of injecting noise at a given frequency to a given noise source (device) of the printed circuit board 14, the coaxial cable 12 for transmitting noise is connected to the signal generator 11 at one end and to the probe 13 at the other end. The signal pin and ground pin of the probe 13 is connected by solder to the power supply and ground pin of a device (IC) of the printed circuit board 14. It is noted that the same connection arrangement as is described above may be used in the case of performing impedance matching using an impedance matching unit. For example, as is shown in FIG. 2, the coaxial cable 12 may be connected to the signal generator 11 at one end and an impedance matching unit 15 at the other end. The signal pin and ground pin of the impedance matching unit 15 may be connected by solder to the power supply and ground pin of a device (IC) on the printed circuit board 14 under examination.

Figure 3:
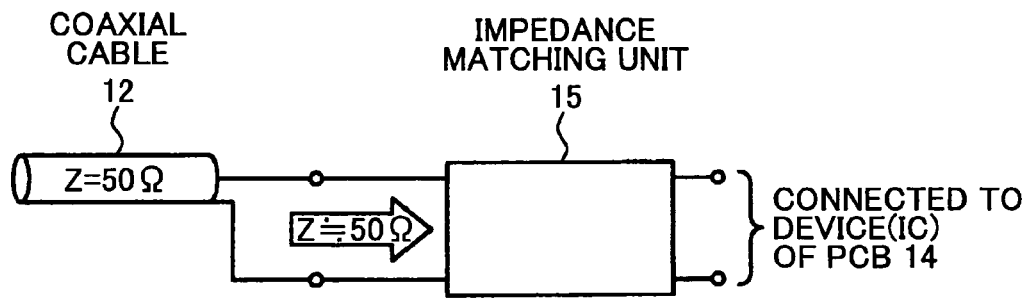
FIG. 3 is a diagrams illustrating impedance matching performed at the noise injection apparatus according to the second embodiment.

FIG. 3 is a diagram illustrating impedance matching between the signal generator 11 side and the printed circuit board 14 side.

It is noted that the impedance of the signal generator 11 and the coaxial cable 12 may generally be 50Ω, but the impedance of the power supply and ground of the device (IC) on the printed circuit board 14 may be significantly lower so that the signal from the signal generator 11 may not be efficiently injected to the power supply and ground of the device (IC) on the printed circuit board 14. Accordingly, the impedance matching unit 15 may be introduced between the coaxial cable 12 and the printed circuit board 14, the impedance at the coaxial cable side 12 may be set to 50Ω, and the impedance at the printed circuit board 14 side may be matched with the impedance of the coaxial cable 12.

Figure 4:
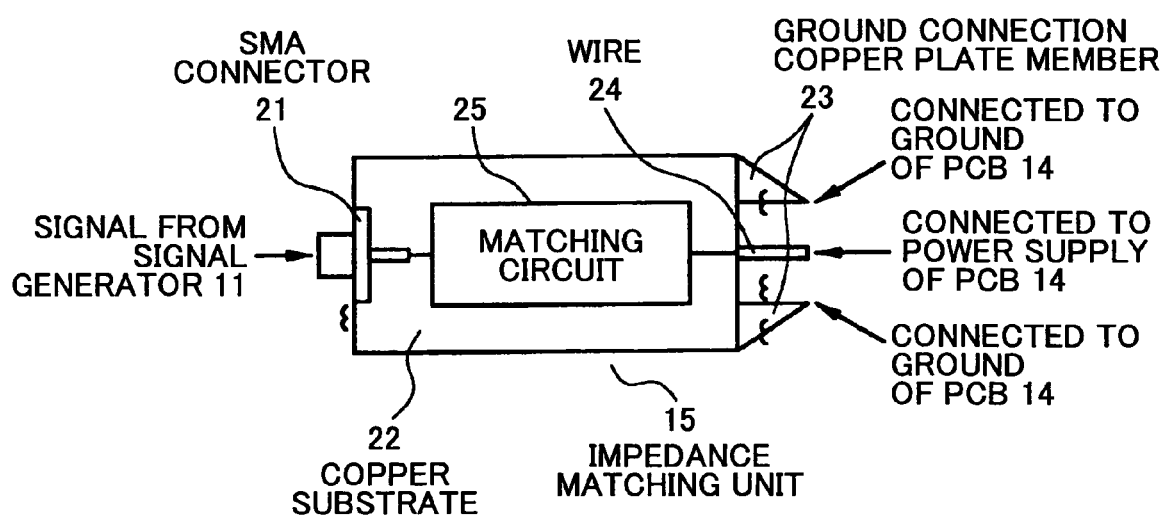
FIG. 4 is a diagram showing a configuration of an impedance matching unit of the noise injection apparatus according to the second embodiment.

FIG. 4 is a diagram showing an exemplary configuration of the impedance matching unit 15 shown in FIGS. 2 and 3.

The illustrated impedance matching unit of FIG. 4 includes an SMA connector 21 for connecting the coaxial cable 12 to the impedance matching unit 15, a copper substrate 22 on which circuit components are mounted, ground connection copper plate members 23 for connecting the impedance matching unit 15 to ground of the printed circuit board 14, a wire 24 that connects a matching circuit 25 to the power supply of the printed circuit board 14, and the matching circuit 25 for matching the impedance of the signal generator 11 and the impedance of the printed circuit board 14.

In this example, the impedance matching unit 15 uses the SMA connector 21 to establish connection with the coaxial cable 12, the wire 24 to establish connection with the power supply of the device (IC) on the printed circuit board 14, and the two copper plate members 23 arranged at the sides of the wire 24 to establish connection with the ground terminal of the device (IC) on the printed circuit board 14.

Figure 5:
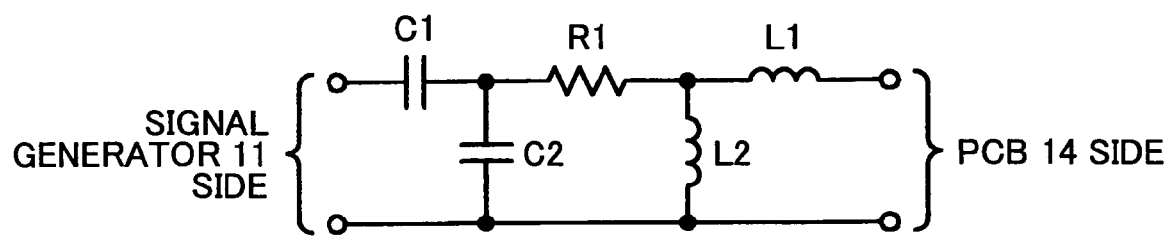
FIG. 5 is a circuit diagram of the impedance matching unit.

FIG. 5 is a circuit diagram of the matching circuit 25 that is configured to perform impedance matching with respect to a predetermined frequency.

In the present embodiment, the matching circuit 25 uses measurements by the Smith chart as a network analyzer to adjust the constant of a circuit composed of inductors and capacitors.

The matching circuit of FIG. 5 includes capacitors C1 and C2, a resistor R1, and inductors L1 and L2. It is noted that one end of the capacitor C1 is connected to a signal portion of the signal generator 11 side, and the other end of the capacitor C1 is connected to one side of the capacitor C1, and the capacitor C2 is connected to one end of the capacitor C1 and one end of the resistor R1. The other end of the resistor R1 is connected to one end of the inductor L2 and one end of the inductor L1.

The other ends of the capacitor C2 and the inductor L2 are connected to ground.

Since the power supply impedance of the printed circuit board 14 is presumably a very small value, it may be difficult to construct the impedance matching unit with merely a capacitor and an inductor. Thus, the resistor R1 is introduced to the matching circuit to enable effective impedance matching between the signal generator 11 side and the impedance matching unit 15 side.

In the case of performing measurement with another frequency using the noise visualization apparatus, the Smith chart may be used as a network analyzer in a similar manner with respect to the relevant frequency used for the measurement, and the constant of the circuit composed of inductors and capacitors may be adjusted so that the impedance of the coaxial cable side may be set to 50Ω.

As can be appreciated, according to the present embodiment, upon performing measurements on the printed circuit board 14 by the noise visualization apparatus, a signal at a given frequency may be efficiently transmitted to the power supply and ground of the device (IC) of the printed circuit board 14.

Third Embodiment

In the following, a noise injection apparatus according to a third embodiment of the present invention that uses the dedicated fastener 40 for fastening the printed circuit board 14 and the probe 13 for performing measurement on the printed circuit board 14 using the noise visualization apparatus is described. The dedicated fastener 40 is used in consideration of the fact that measurement results may vary depending on the relative positioning of the coaxial cable 12 and the printed circuit board 14 at the time the measurement is made due to influences of emissions from the coaxial cable 12.

Figure 6:
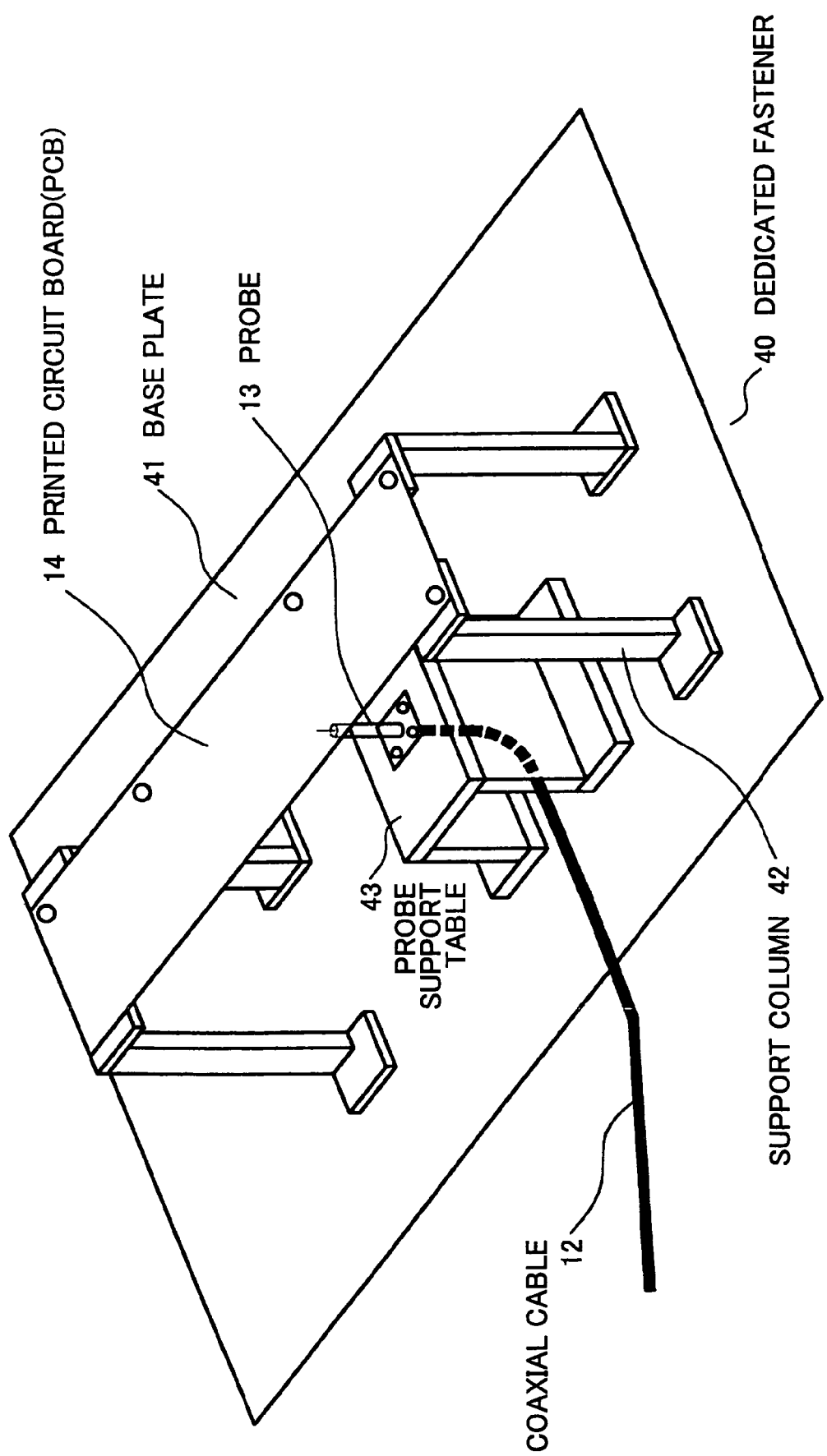
FIG. 6 is a diagram showing a configuration of a noise injection apparatus according to a third embodiment of the present invention.

FIG. 6 is a perspective view of the dedicated fastener 40 for fastening the printed circuit board 14 and the probe 13 according to the third embodiment of the present invention.

The illustrated fastener 40 includes a base plate 41 on which support columns (support members) 42 and a probe support table 43 are mounted, the support columns 42 for fastening the printed circuit board 14, and the probe support table 43 for fastening the SMA connector of the probe 13 to the printed circuit board 14 in a manner such that the probe 13 may be positioned perpendicular to the measuring surface of the printed circuit board 14.

As is described in relation to the first embodiment, in the case of performing measurement on the printed circuit board 14 using a noise visualization apparatus, a signal (noise) at a given frequency is set at the signal generator 11, and the power supply and ground of the probe 13 is solder-connected to the power supply and ground of a noise source (device) of the printed circuit board. In this case, the SMA connector of the probe 13 is fastened to the probe support table 43 with screws so that the probe 13 may be perpendicular to the measuring surface of the printed circuit board 14. By arranging the probe 13 to be perpendicular to the measuring surface of the printed circuit board 14, a portion of the coaxial cable 12 connected to the probe 13 may also be perpendicular to the measuring surface of the printed circuit board 14. That is, the coaxial cable 12 may be prevented from extending close to the measuring surface of the printed circuit board 14 in a parallel manner so that electromagnetic interference from the coaxial cable 12 to the printed circuit board 14 may be prevented.

Also, by fastening the printed circuit board 14 to the four support columns 42, the distance between the measuring surface of the printed circuit board 14 and the sensor of the noise visualization apparatus may be fixed. In this way, variations in measurements due to tilting of the measuring surface of the printed circuit board 14 may be prevented.

As can be appreciated from the above-descriptions, by using the dedicated fastener 40 for fastening the printed circuit board 14, variations in measurements due to variations in the relative positioning of the coaxial cable 12 and the printed circuit board 14 at the time of measurement may be prevented so that deviations in measurements may be reduced.

Fourth Embodiment

In the following, a noise injection apparatus is described that uses a miniature oscillator as the signal generator and converts the output of the miniature oscillator into a sine wave signal using a BPF (band pass filter) in order to counter problems arising from emissions from the coaxial cable 12 due to standing waves superposed on the coaxial cable 12.

Figure 7:
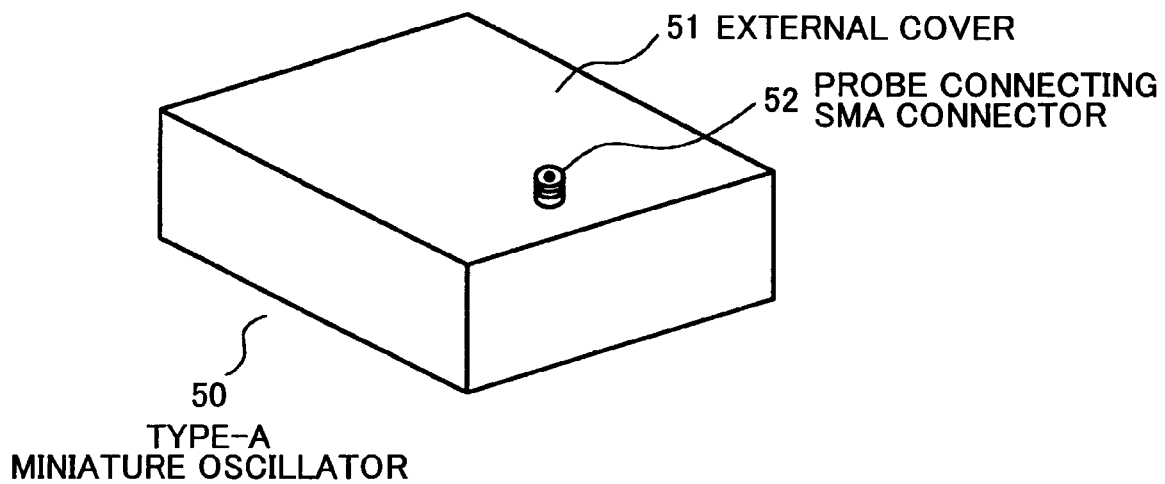
FIG. 7 is an external perspective view of a Type-A miniature oscillator that is used in a noise injection apparatus according to a fourth embodiment of the present invention.
Figure 8:
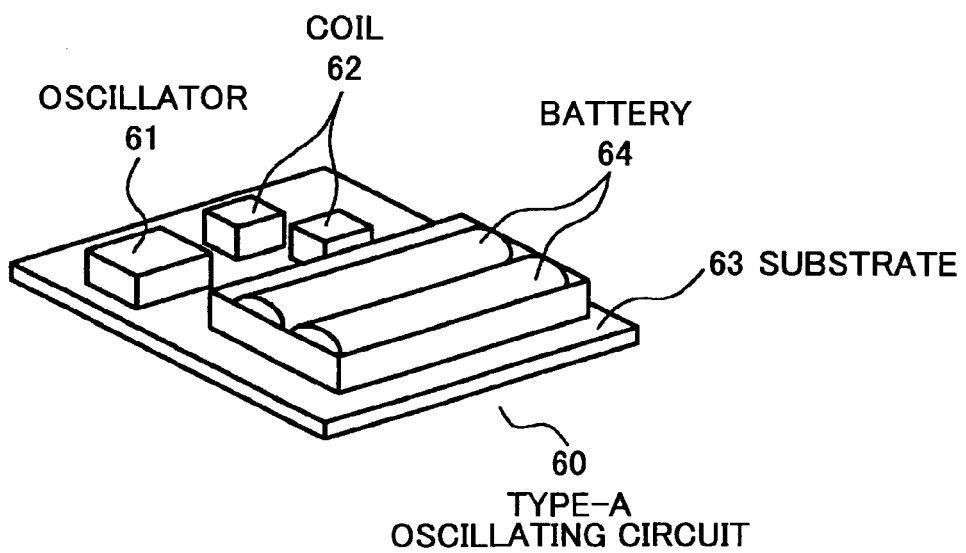
FIG. 8 is an internal perspective view of the Type-A miniature oscillator.
Figure 9:
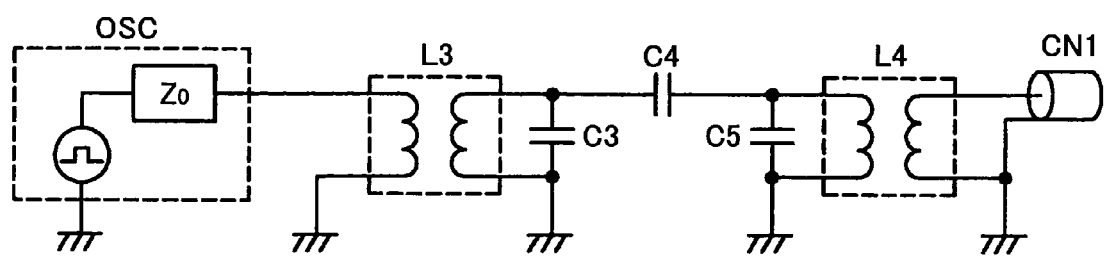
FIG. 9 is a circuit diagram of an oscillating circuit of the Type-A miniature oscillator.

FIG. 7 is an external perspective view of a Type-A miniature oscillator 50. FIG. 8 is a perspective view of a Type-A oscillating circuit 60 that is arranged inside the miniature oscillator 50 shown in FIG. 7. FIG. 9 is a circuit diagram of the Type-A miniature oscillator 50.

The Type-A miniature oscillator 50 of FIG. 7 includes an external cover 51 made of copper plate for preventing emission of electromagnetic waves generated from its interior, and a probe connecting SMA connector 52 that outputs a signal (noise) at a given frequency that is generated by the Type-A oscillating circuit 60 of FIG. 8.

It is noted that the external cover 51 for preventing emission of internally generated electromagnetic waves to the exterior is not limited to a copper plate cover and may be made of any material such as a steel plate that can block electromagnetic waves.

As is shown in FIG. 8, the Type-A oscillating circuit 60 includes an oscillator 61 that outputs a signal (noise) at a given frequency, coils 62 for removing spurious components included in the oscillator output, a substrate 63 on which circuit components are mounted, and batteries 64 for operating the circuit components.

The substrate 63 has copper tape arranged on its open space where components are not mounted in order to stabilize the ground of the Type-A oscillating circuit 60 and stabilize operations of the Type-A oscillating circuit 60.

As is shown in FIG. 9, the Type-A oscillating circuit 60 includes a multiple-tuned circuit composed of two stages of LC tuned circuits as the BPF. In the Type-A oscillating circuit 60, a rectangular wave at a certain frequency is output from the oscillator OSC, and spurious components are removed from the output of the oscillator OSC by a tuned circuit composed of an inductor L3 and a capacitor C3. Then, the resulting output is input through a coupling capacitor C4 to another tuned circuit composed of an inductor L4 and a capacitor C5 to secure bandwidth/attenuation and output a signal (noise) at the given frequency via the probe connecting SMA connector CN1.

Figure 10:
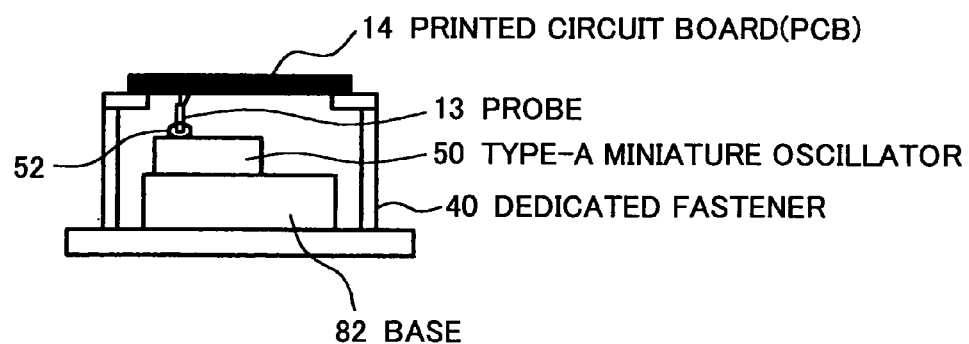
FIG. 10 is a diagram showing a configuration of a noise injection apparatus according to the fourth embodiment.

FIG. 10 is a diagram illustrating an exemplary arrangement of the Type-A miniature oscillator 50 in the case of performing measurement on the printed circuit board 14 using a noise visualization apparatus.

In the illustrated example, the printed circuit board 14 is fastened to the dedicated fastener 40, and the Type-A miniature oscillator 50 is placed on a base 82 and is positioned under the printed circuit board 14. In another example, if the Type-A miniature oscillator 50 is sufficiently small in size, the base 82 may be omitted and the Type-A miniature oscillator may be directly connected to the printed circuit board 14. In FIG. 10, the probe connecting SMA connector 52 of the Type-A miniature oscillator 50 and the probe 13 are connected, and the signal and ground terminals of the probe 13 are solder-connected to the power supply and ground of the device (IC) on the printed circuit board 14 to which noise is to be injected. By arranging the Type-A miniature oscillator 50 in the manner described above upon performing measurement on the printed circuit board 14 with the noise visualization apparatus, measurements resulting from injecting a signal (noise) to the power supply and ground of the device (IC) of the printed circuit board 14 may not be affected by emissions from the coaxial cable 12.

Fifth Embodiment

In the following a noise injection apparatus is described that uses a miniature oscillator as the signal generator and lowers the output impedance of the miniature oscillator in order to solve the problem related to emissions from the coaxial cable due to standing waves superposed on the coaxial cable.

The power supply impedance of a printed circuit board is generally lower than the output impedance of an oscillator, and therefore, measures are normally taken to adjust the output impedance of an oscillator to be closer to the output impedance of the device (IC) rather than merely connecting the oscillation output to the power supply and ground of the device (IC). In this way, measurement results that closely resemble the actual behavior of the printed circuit board may be obtained.

Figure 11:
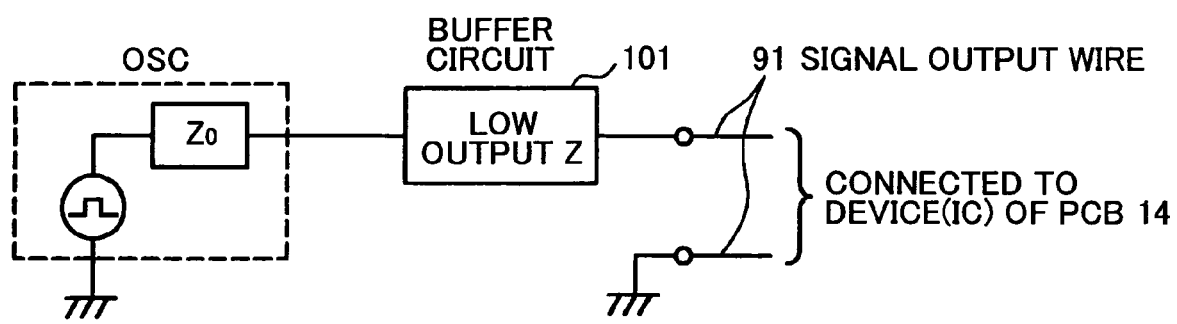
FIG. 11 is a diagram showing a configuration of a low-output buffer circuit that is used in a noise injection apparatus according to a fifth embodiment of the present invention.

FIG. 11 is a diagram illustrating a configuration of a low-output buffer circuit.

The illustrated buffer circuit 101 is arranged between an oscillator OSC and a signal output wire 91. By adjusting the output impedance of the buffer circuit 101 to a low value, the output impedance of the oscillator OSC may be adjusted to a lower value.

In the following one specific example is described in which the buffer circuit 101 uses parallel connections of inverters (INV) to obtain low-output impedance.

Figure 12:
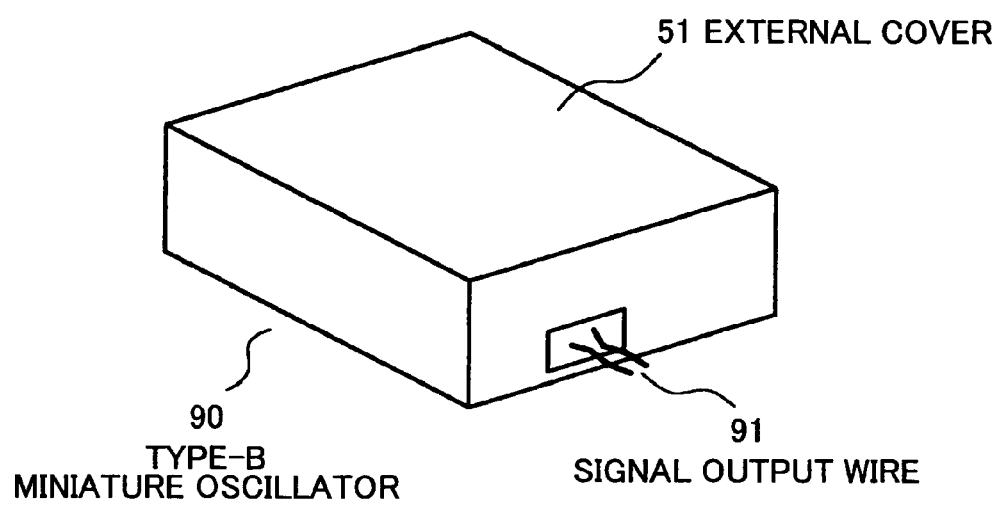
FIG. 12 is an external perspective view of a Type-B miniature oscillator that is used in the noise injection apparatus according to the fifth embodiment.
Figure 13:
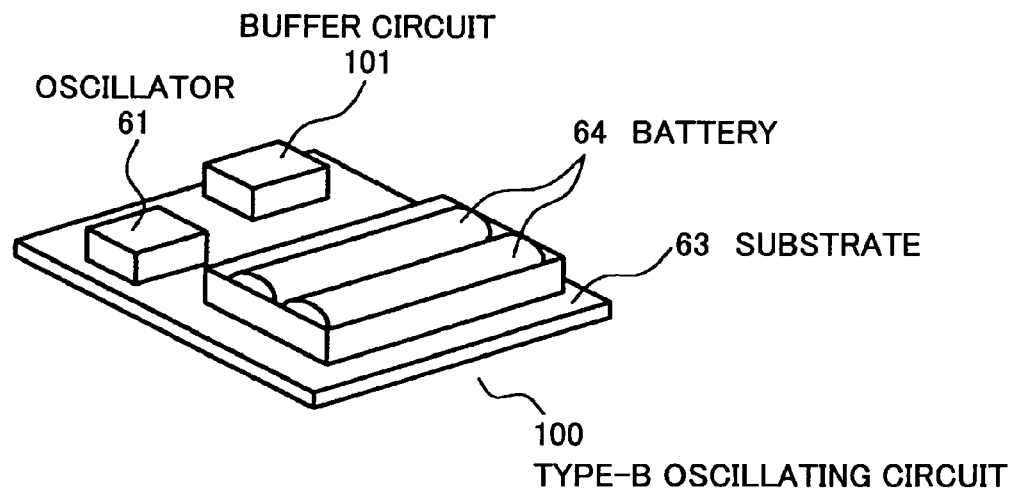
FIG. 13 is an internal perspective view of the Type-B miniature oscillator.
Figure 14:
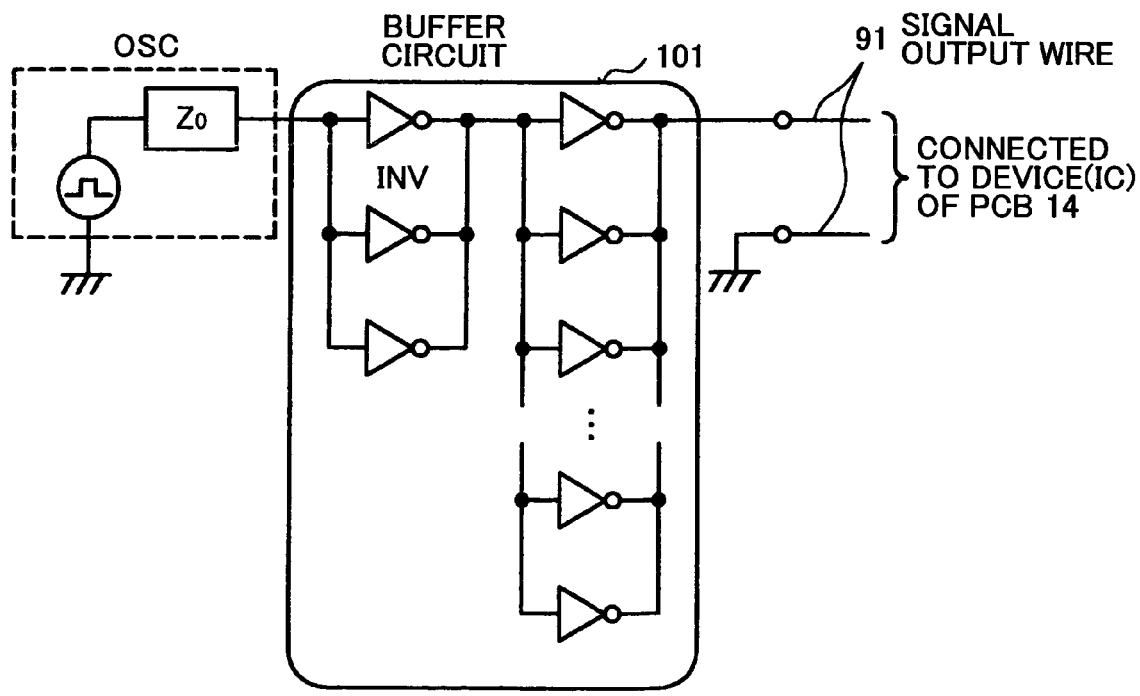
FIG. 14 is a circuit diagram of the low-output buffer circuit.

FIG. 12 is an external perspective view of a Type-B miniature oscillator 90. FIG. 13 is a perspective view of a Type-B oscillating circuit 100 that is accommodated inside the Type-B miniature oscillator 90. FIG. 14 is a circuit diagram of the Type-B oscillating circuit 100.

As is shown in FIG. 12, the Type-B miniature oscillator 90 includes an external cover 51 made of copper plate for preventing emission of its internally-generated magnetic waves, and a signal output wire 91 for outputting a signal (noise) at a given frequency that is generated at the Type-B oscillating circuit 100.

It is noted that the external cover 51 for preventing emission of internally generated electromagnetic waves to the exterior is not limited to a copper plate cover, and may be made of any material such as a steel plate that can block electromagnetic waves.

As is shown in FIG. 13, the Type-B oscillating circuit 100 includes an oscillator 61 that outputs a signal (noise) at the given frequency, the buffer circuit 101 that includes inverters that are connected in parallel, a substrate 63 on which circuit components are mounted, and batteries 64 for operating these circuit components. The substrate 63 has a copper tape arranged on its open space where components are not mounted in order to stabilize the ground of the Type-B oscillating circuit 100 and stabilize operations of the Type-B oscillating circuit 100.

Also, in the Type-B oscillating circuit 100, a rectangular wave at the given frequency is output from the oscillator OSC and input to an inverter INV for improving the drive performance of the buffer circuit 101. The resulting output is then input to the buffer circuit 101 including inverters INV that are connected in parallel as is shown in FIG. 14 and supplied to the signal output wire 91 so that a rectangular wave signal at the given frequency may be output.

It is noted that the inverter INV for improving the drive performance of the buffer circuit 101 is implemented in consideration of the fan-out of oscillator OSC. Thus, if the oscillator OSC is able to drive the number of inverters that are connected in parallel, the above inverter for improving drive performance does not necessarily have to be implemented.

In the present example, since the inverters INV are connected in parallel, the output impedance of the Type-B oscillating circuit 100 may be equal to a value obtained by dividing the output impedance of one inverter INV by the number of inverters INV that are connected in parallel. In this way, the output impedance of the Type-B oscillating circuit 100 may be reduced to a lower impedance value. It is noted that the output impedance of the Type-B oscillating circuit 100 may be adjusted by adjusting the number of inverters INV that are connected in parallel.

Figure 15:
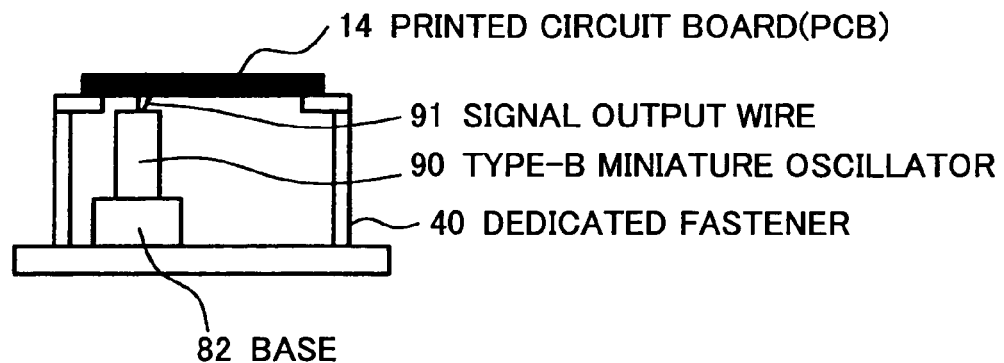
FIG. 15 is a diagram showing a configuration of the noise injection apparatus according to the fifth embodiment.

FIG. 15 is a diagram showing an exemplary configuration of the noise injection apparatus using the Type-B miniature oscillator 90 according to the present embodiment.

In the illustrated example, the printed circuit board 14 subject to measurement by a noise visualization apparatus is fastened to the dedicated fastener 40, and the Type-B miniature oscillator 90 is placed on the base 82 and positioned under the printed circuit board 14. In one embodiment, when the Type-B miniature oscillator 90 is sufficiently small, the base 82 may not have to be used and the Type-B miniature oscillator 90 may be directly connected to the printed circuit board 14.

Further, in the present example, the signal and ground terminals of the signal output wire 91 are solder-connected to the power supply and ground of the device (IC) on the printed circuit board 14 that is subject to noise injection. By performing measurement on the printed circuit board 14 with the noise visualization apparatus using such an arrangement, emissions from the coaxial cable 12 may be prevented from affecting the measurements of the printed circuit board 14, and the output impedance of the oscillator may be adjusted to a value close to the output impedance of the device of the printed circuit board 14 so that measurements that closely resemble the actual behavior of the printed circuit board 14 may be obtained upon injecting noise to the power supply and ground of the device of the printed circuit board 14.

Although the present invention is shown and described with respect to certain preferred embodiments, it is obvious that equivalents and modifications will occur to others skilled in the art upon reading and understanding the specification. The present invention includes all such equivalents and modifications, and is limited only by the scope of the claims.

The present application is based on and claims the benefit of the earlier filing dates of Japanese Patent Application No. 2005-022866 filed on Jan. 31, 2005, and Japanese Patent Application No. 2006-019220 filed on Jan. 27, 2006, the entire contents of which are hereby incorporated by reference.

What is claimed is:

1. A noise injection apparatus that injects noise to a printed circuit board, the apparatus comprising:
    a signal generator that generates noise;
    a coaxial cable having one end connected to an output of the signal generator; and
    a probe that is connected to another end of the coaxial cable and is configured to convey the noise generated by the signal generator to a power supply and a ground pin of a device element of the printed circuit board via the coaxial cable, wherein the probe is a semi-rigid cable that includes an SMA connector.

2. A noise injection apparatus that injects noise to a printed circuit board, the apparatus comprising:
    a signal generator that generates noise;
    a coaxial cable having one end connected to the signal generator; and
    an impedance matching unit that is connected to another end of the coaxial cable and is configured to convey the noise generated by the signal generator to a power supply and a ground pin of a device element of the printed circuit board via the coaxial cable.

3. The noise injection apparatus as claimed in claim 2, wherein the impedance matching unit includes an SMA connector that is connected to the coaxial cable, a matching circuit that matches an impedance of the signal generator to an impedance of the printed circuit board, a copper substrate on which one or more circuit components including the matching circuit are mounted, a ground connecting copper plate member that is connected to the ground pin of the printed circuit board, and a wire that is connected to the power supply of the printed circuit board.

4. The noise injection apparatus as claimed in claim 3, wherein
    the matching circuit includes a first capacitor, a second capacitor, a resistor, a first inductor, and a second inductor;
    the first capacitor has one end connected to a signal output of the signal generator and another end connected to one end of the second capacitor and one end of the resistor;
    the resistor has another end connected to one end of the first inductor and one end of the second inductor; and
    the second capacitor and the second inductor each have another end connected to ground.

5. A noise injection apparatus that injects noise to a printed circuit board, the apparatus comprising:
    a printed circuit board support member that fastens the printed circuit board in place;

a probe including an SMA connector; and a probe support member that fastens the probe such that the SMA connector of the probe is positioned perpendicular to a measuring surface of the printed circuit board.

6. A noise injection apparatus that injects noise to a printed circuit board, the apparatus comprising:

an oscillator unit that includes an oscillating circuit that uses a band pass filter to output a sine wave signal, the oscillating circuit including an oscillator that outputs a signal at a given frequency, a coil that removes spurious components included in the output of the oscillator, a substrate on which circuit components including the oscillator and the coil are mounted, a battery for operating the circuit components, and a probe connecting SBA connector.

7. The noise injection apparatus as claimed in claim 6, wherein the band pass filter includes a first tuned circuit having a first inductor and a first capacitor, a second capacitor, and a second tuned circuit having a second inductor and a third capacitor:

the oscillator outputs a rectangular wave signal at the given frequency;

the first tuned circuit removes spurious components included in the output of the oscillator and passes a resulting output to the second tuned circuit via the second capacitor; and the second tuned circuit secures bandwidth and attenuation of the resulting output from the first tuned circuit and outputs a signal at the given frequency to the printed circuit board via the probe connecting SMA connector.

8. A noise injection apparatus that injects noise to a printed circuit board, the apparatus comprising:

an oscillator unit that includes an oscillator that outputs a signal at a given frequency;

a buffer circuit having a plurality of inverters that are connected in parallel;

a substrate on which circuit components including the oscillator and the buffer circuit are mounted;

a battery for operating the circuit components; and a signal output wire that is connected to the printed circuit board.

9. The noise injection apparatus as claimed in claim 8, further comprising:

a dedicated fastener for fastening the printed circuit board in place; and a base that places the oscillator unit under the printed circuit board.

10. The noise injection apparatus as claimed in claim 8, wherein the signal output wire is soldered to a power supply and ground of a device element of the printed circuit board.

* * * * *